US010043911B2

(12) United States Patent
Yan et al.

(10) Patent No.: US 10,043,911 B2
(45) Date of Patent: Aug. 7, 2018

(54) THIN FILM TRANSISTOR, METHOD FOR FABRICATING THE SAME, ARRAY SUBSTRATE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Changjiang Yan, Beijing (CN); Xiaowei Jiang, Beijing (CN); Xiaohui Jiang, Beijing (CN); Zhenyu Xie, Beijing (CN); Xu Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/361,751

(22) PCT Filed: Dec. 12, 2013

(86) PCT No.: PCT/CN2013/089287
§ 371 (c)(1),
(2) Date: May 30, 2014

(87) PCT Pub. No.: WO2015/000267
PCT Pub. Date: Jan. 8, 2015

(65) Prior Publication Data
US 2015/0214254 A1 Jul. 30, 2015

(30) Foreign Application Priority Data
Jul. 1, 2013 (CN) .......................... 2013 1 0272556

(51) Int. Cl.
*H01L 29/786* (2006.01)
*H01L 29/417* (2006.01)
(Continued)

(52) U.S. Cl.
CPC .... *H01L 29/78633* (2013.01); *H01L 27/1262* (2013.01); *H01L 29/41733* (2013.01);
(Continued)

(58) Field of Classification Search
CPC ............ H01L 27/1248; H01L 27/1262; H01L 29/786; H01L 29/78633; H01L 29/41733; H01L 29/458
See application file for complete search history.

(56) References Cited

U.S. PATENT DOCUMENTS 4,984,033 A * 1/1991 Ishizu et al. .................... 257/98
6,410,969 B1 * 6/2002 Tateishi ............ H01L 29/78633
257/350
(Continued)

FOREIGN PATENT DOCUMENTS

CN    101241937 A      8/2008
CN    101866071 A *   10/2010
(Continued)

OTHER PUBLICATIONS

JP 2008218960 A—machine translation.*
(Continued)

*Primary Examiner* — Tom Thomas
*Assistant Examiner* — Vincent Wall
(74) *Attorney, Agent, or Firm* — Ladas & Parry LLP

(57) ABSTRACT

A thin film transistor (TFT), a method for fabricating the same, an array substrate and a display device are provided. The TFT includes a source electrode and a drain electrode, a semiconductor active layer, a gate insulating layer and a gate electrode. The TFT further includes a light-shielding
(Continued)

layer between the source electrode and the drain electrode. The light-shielding layer separates the source electrode and the drain electrode, and the light-shielding layer is disposed on a light incident side of the semiconductor active layer and is used to prevent the incident light from irradiating on the semiconductor active layer.

11 Claims, 4 Drawing Sheets

(51) Int. Cl.
    *H01L 29/45*     (2006.01)
    *H01L 27/12*     (2006.01)
    *H01L 29/66*     (2006.01)

(52) U.S. Cl.
    CPC ............ *H01L 29/45* (2013.01); *H01L 29/458* (2013.01); *H01L 29/66969* (2013.01); *H01L 29/7869* (2013.01)

(56) References Cited

U.S. PATENT DOCUMENTS

| | | | |
|---|---|---|---|
| 7,864,254 B2 * | 1/2011 | Kim et al. ...................... | 349/40 |
| 2006/0262242 A1 * | 11/2006 | Koma .................... | G02F 1/1336 349/69 |
| 2007/0254456 A1 * | 11/2007 | Maruyama et al. .......... | 438/458 |
| 2008/0100766 A1 * | 5/2008 | Ming et al. .................... | 349/44 |
| 2008/0309235 A1 * | 12/2008 | Yamazaki ........... | H01L 27/3272 313/512 |
| 2009/0166634 A1 * | 7/2009 | Lin ................... | G02F 1/133555 257/59 |
| 2009/0284677 A1 * | 11/2009 | Shin et al. ...................... | 349/46 |
| 2009/0321732 A1 * | 12/2009 | Kim .................... | H01L 29/7869 257/43 |
| 2012/0107627 A1 * | 5/2012 | Gao ..................... | C23C 18/1637 428/450 |
| 2012/0241784 A1 * | 9/2012 | Tang et al. ....................... | 257/98 |
| 2012/0280234 A1 * | 11/2012 | Koezuka ........... | H01L 29/78606 257/57 |
| 2013/0119377 A1 * | 5/2013 | Noda ................ | H01L 29/66969 257/43 |
| 2015/0129867 A1 * | 5/2015 | Takamaru et al. .............. | 257/43 |

FOREIGN PATENT DOCUMENTS

| | | | | |
|---|---|---|---|---|
| CN | 103367165 A | | 10/2013 | |
| CN | 203312302 U | | 11/2013 | |
| JP | H06267912 A | * | 9/1994 | ........... G02F 1/1343 |
| JP | 2008218960 A | * | 9/2008 | |

OTHER PUBLICATIONS

CN 101866071 A machine translation.*
Machine translation of JP H06267912 A.*
Chen, et al., "Properties of Disorder-Engineered Black Titanium Dioxide Nanoparticles through Hydrogenation",DOI: 10.1038/srep01510, Mar. 26, 2013, pp. 1-7.*
International Search Report dated Mar. 27, 2014; Appln. No. PCT/CN2013-089287.
First Chinese Office Action dated Jun. 30, 2015; Appln. No. 201310272556.1.
International Preliminary Report on Patentability dated Jan. 5, 2016; PCT/CN2013-089287.
Second Chinese Office Action dated Jan. 13, 2016; Appln. No. 201310272556.1.
Third Chinese Office Action dated Jan. 8, 2016; Appln. No. 201310272556.1.

* cited by examiner

THIN FILM TRANSISTOR, METHOD FOR FABRICATING THE SAME, ARRAY SUBSTRATE AND DISPLAY DEVICE

TECHNICAL FIELD

Embodiments of the invention relate to a Thin Film Transistor (TFT), a method for fabricating the same, an array substrate, and a display device.

BACKGROUND

FIG. 1 schematically illustrates a configuration of a conventional bottom-gate TFT. The TFT comprises: a gate electrode 60, a gate insulating layer 70, a source electrode 20, a drain electrode 30, a semiconductor active layer 40 and a protection layer 90 formed on a base substrate 10. An array substrate comprising the TFT further comprises a passivation layer 50 and a pixel electrode 80. The gate electrode 60 of the bottom-gate TFT may block light from the backlight, preventing the semiconductor active layer 40 from being irradiated by the backlight and further causing the TFT to generate a leakage current. To prevent water and oxygen in the environment from affecting the semiconductor active layer 40, such configured TFT further has the protection layer 90 disposed above the semiconductor active layer 40. The protection layer 90 can prevent water and oxygen in the environment from affecting the metal oxide semiconductor active layer 40. However, the protection layer 90 in such a configuration is mostly a non-metal, which will cause the TFT to generate a leakage current. FIG. 2 schematically illustrates a configuration of a conventional top-gate TFT; the TFT comprises a drain electrode 200, a source electrode 300, an active layer 400, a gate insulating layer 500, a gate electrode 600 formed on a base substrate 100. An array substrate comprising the TFT further comprises a passivation layer 700 and a pixel electrode 800. In the top-gate TFT illustrated in FIG. 2, the gate electrode 600 can prevent the ambient light from affecting the semiconductor active layer 400. The drain electrode 200 and the source electrode 300 are separated from each other, light from the backlight can pass through the transparent base substrate 100 and irradiate the semiconductor active layer 400. Moreover, the semiconductor active layer 400 contacts the drain electrode 200 and the source electrode 300 at the same time. After being irradiated by the light, the semiconductor active layer 400 will generate a conductive passage between the drain electrode 200 and the source electrode 300, thereby causing the TFT to generate a leakage current.

It is seen from the above that the conventional top-gate TFT can easily generate a leakage current under the influence of the backlight.

SUMMARY

Embodiments of the invention provide a TFT, a method for fabricating the same, an array substrate and a display device. The TFT provided by the embodiment of the invention can solve the problem of causing the TFT to generate the leakage current with the semiconductor active layer irradiated by light.

An embodiment of the invention provides a TFT, comprising a source electrode and a drain electrode, a semiconductor active layer, a gate insulating layer and a gate electrode, and a light-shielding layer disposed between the source electrode and the drain electrode, wherein the light-shielding layer separates the source electrode and the drain electrode, and the light-shielding layer is disposed on a side of the semiconductor active layer which is further away from the gate electrode.

An embodiment of the invention provides an array substrate comprising the above TFT.

An embodiment of the invention provides a display device comprising the array substrate.

An embodiment of the invention provides a method for fabricating a TFT; the method comprises forming a source electrode, a drain electrode and a light-shielding layer, wherein the light-shielding layer is disposed between and separate the source electrode and the drain electrode; forming a semiconductor active layer, the semiconductor active layer comprising two end portion overlaying with the source electrode and the drain electrode and a middle portion corresponding to the light-shielding layer; forming a gate insulating layer and a gate electrode above the source electrode, the drain electrode and the semiconductor active layer.

In summary, the embodiments of the invention provide a TFT, a method for fabricating the same, an array substrate and a display device. The TFT comprises a source electrode, a drain electrode, a semiconductor active layer, a gate insulating layer and a gate electrode; the TFT further comprises a light-shielding layer disposed between the source electrode and the drain electrode; the light-shielding layer blocks the source electrode and the drain electrode, and the light-shielding layer is disposed on the light incident side of the semiconductor active layer, and configured for blocking the incident light from irradiating the semiconductor active layer, thereby solving the problem of causing the TFT to generate the leakage current with the semiconductor active layer irradiated by light. As a result, a TFT with highly stable properties is realized.

BRIEF DESCRIPTION OF THE DRAWINGS

In order to clearly illustrate the technical solution of the embodiments of the invention, the drawings of the embodiments will be briefly described in the following. It is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiments of the invention provide a TFT, a method for fabricating the same, an array substrate and a display device, so as to solve the problem of causing the TFT to generate the leakage current with the semiconductor active layer irradiated by light.

An embodiment of the invention provides a TFT, comprising a source electrode and a drain electrode, a semiconductor active layer, a gate insulating layer and a gate electrode. The TFT further comprises a light-shielding layer disposed between the source electrode and the drain electrode, the light-shielding layer separates the source electrode and the drain electrode, and the light-shielding layer is disposed on a light incident side of the semiconductor active layer, blocking the incident light from irradiating the semiconductor active layer. That is to say, the light-shielding layer is disposed on a side of the semiconductor active layer which is further away from the gate electrode.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprises," "comprising," "includes," "including," etc., are intended to specify that the elements or the objects stated before these terms encompass the elements or the objects and equivalents thereof listed after these terms, but do not preclude other elements or objects. "On," "under," "right," "left," "bottom," "top" and the like are only used to indicate relative position relationship, and when the position of the object which is described is changed, the relative position relationship may be changed accordingly.

It will be described in the following in connection with the embodiments.

Figure 1:
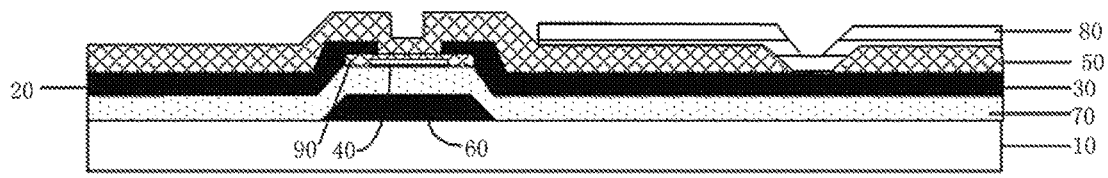
FIG. 1 schematically illustrates a configuration of a conventional bottom-gate TFT.
Figure 2:
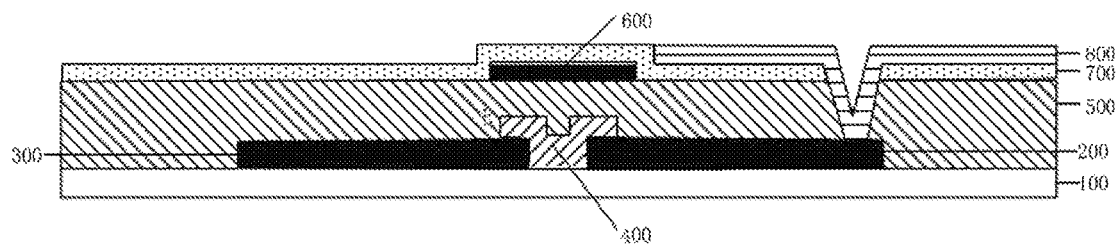
FIG. 2 schematically illustrates a configuration of a conventional top-gate TFT.
Figure 3:
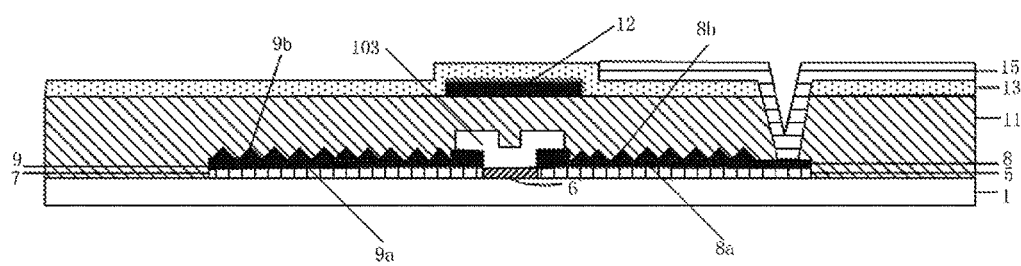
FIG. 3 schematically illustrates a configuration of a TFT provided by an embodiment of the invention.

As illustrated in FIG. 3, an embodiment of the invention provides a TFT, comprising: a first drain electrode layer 5 and a first source electrode layer 7 disposed on a base substrate 1, a second drain electrode layer 8 disposed on the first drain electrode layer 5 and a second source electrode layer 9 disposed on the first source electrode layer 7, a semiconductor active layer 103, a gate insulating layer 11 and a gate electrode 12. The TFT further comprises: a light-shielding layer 6 disposed between the first drain electrode layer 5 and the first source electrode layer 7, the light-shielding layer 6 separates the first drain electrode layer 5 and the first source electrode layer 7; the light-shielding layer 6 is disposed under the semiconductor active layer 103, to block incident light from irradiating the semiconductor active layer 103. An array substrate comprising the TFT further comprises a passivation layer 13 and a pixel electrode 15.

As an example, a material of the light-shielding layer 6 is an oxide of metal titanium or an oxide of metal aluminum.

As an example, the source electrode and the drain electrode has a dual-layer or multi-layer configuration. The source electrode comprises the first source electrode layer 7 and the second source electrode layer 9; the drain electrode comprises the first drain electrode layer 5 and the second drain electrode layer 8. The first source electrode layer 7 and the first drain electrode layer 5 are disposed on the base substrate 1, the second source electrode layer 9 is disposed on the first source electrode layer 7 and overlays the first source electrode layer 7, the second drain electrode layer 8 is disposed on the first drain electrode layer 5 and overlays the first drain electrode layer 5. The second drain electrode layer 8 comprises a flat lower surface 8a contacting the first drain electrode layer 5 and a sawtooth upper surface 8b, the second source electrode layer 9 comprises a flat lower surface 9a contacting the first source electrode layer 7 and a sawtooth upper surface 9b.

As an example, the second source electrode layer and/or the second drain electrode layer is a sawtooth protection layer, the sawtooth upper surface 8b of the second drain electrode layer 8 and the sawtooth upper surface 9b of the second source electrode layer 9 may reflect ambient light. The second source electrode layer 9 comprising the sawtooth upper surface is also referred to as the reflective source electrode 9, the second drain electrode layer 8 comprising the sawtooth upper surface is also referred to as the reflective drain electrode 8. Moreover, detailed shapes of the second drain electrode layer 8 and the second source electrode layer 9 may be just flat without the sawtooth upper surface. It can be contemplated that the detailed shape of the second drain electrode layer 8 and the second source electrode layer 9 may also be other shapes.

As an example, a material of the first source electrode layer 7 is metal titanium (Ti) or aluminum (Al); a material of the first drain electrode layer 5 is metal titanium (Ti) or aluminum (Al). Metal Ti or Al has low resistance; a metal with low resistance can reduce the resistance of the TFT while reducing the line width of the first source and drain electrode layers.

As an example, a material of the second source electrode layer 9 is metal molybdenum (Mo) or chrome (Cr); a material of the second drain electrode layer 8 is metal molybdenum (Mo) or chrome (Cr). Metal Mo or Cr does not readily react with oxygen, therefore it can function as the protection layer, protecting underlying metals from being oxidized.

The source electrode and the drain electrode of the TFT provided by the embodiment of the invention may also have a multi-layer structure. The source electrode comprises a first source electrode layer in a bottom layer, a second source electrode layer in a top layer and other source electrode layers disposed between the first and second source electrode layers; the drain electrode comprises a first drain electrode layer in a bottom layer, a second drain electrode layer in a top layer and other drain electrode layers disposed between the first and second drain electrode layers. As an example, the second drain electrode layer comprises a sawtooth upper surface, the second source electrode layer also comprises sawtooth upper surface. A material of the second source electrode layer and the second drain electrode layer is preferably a metal with stable nature and not readily reacting with oxygen, such as Mo or Cr, so as to protect the other underlying source and drain electrode layers. The first source electrode layer and other source electrode layers are preferably made of a metal with low resistivity, such as Ti or Al. The first drain electrode layer and other drain electrode layers are preferably made of a metal with low resistivity, such as Ti or Al. The sawtooth upper surfaces of the second drain electrode layer and the second source electrode layer can enhance reflection of the ambient light and change propagation direction of light.

The light-shielding layer of the TFT provided by the embodiment of the invention is disposed between the source and drain electrodes and on the light incident side of the semiconductor active layer. Upon the source and drain electrodes having a dual-layer or multi-layer structure, the light-shielding layer can be disposed in the same film layer as the first source and drain electrode layers, separating the first source electrode layer and the first drain electrode layer.

The light-shielding layer may also span across multiple film layers, separating the first source electrode layer and the first drain electrode layer as well as the second source electrode layer and the second drain electrode layer.

As illustrated in FIG. 3, the TFT provided by the embodiment of the invention is a top gate TFT. The TFT of invention may also be otherwise configured TFTs, such as a bottom-gate TFT. The TFT comprises the light-shielding layer; the light-shielding layer is disposed on a side of the semiconductor active layer which is further away from the gate electrode, blocking ambient light from irradiating the semiconductor active layer. Other details will not be elaborated here.

Actually, being it a bottom-gate TFT or a top-gate TFT, the light-shielding layer can always be disposed on a side of the semiconductor active layer which is further away from the gate electrode. By this means, the semiconductor active layer is disposed between the gate electrode and the light-shielding layer, the gate insulating layer is disposed between the semiconductor active layer and the gate electrode. Therefore, a side of the semiconductor active layer can be shielded from light through the gate electrode, and the other side can be shielded from light through the light-shielding layer. As a result, whether for the bottom-gate TFT or the top-gate TFT, the semiconductor active layer can be shielded from light irradiation.

Moreover, the light-shielding layer of the invention is obtained by oxidizing the metal of the source/drain electrode. That is to say, the light-shielding layer is made up of an oxide of the metal of the source/drain electrode, which can simplify the fabrication process, without introducing too many extra processes to form the light-shielding layer.

An embodiment of the invention provides an array substrate, with the array substrate comprising the above TFT. In another embodiment of the present invention, a display device includes the array substrate. The display device may, for example, be a liquid crystal display device, but may also be other types of display devices.

An embodiment of the invention provides a method for fabricating a TFT. The method comprises: forming a source electrode, a drain electrode and a light-shielding layer, wherein the light-shielding layer is disposed between the source electrode and the drain electrode and separates the source electrode and the drain electrode; forming a semiconductor active layer; the light-shielding layer is disposed on a light incident side of the semiconductor active layer and blocks incident light from irradiating the semiconductor active layer; forming a gate insulating layer and a gate electrode above the source electrode, the drain electrode and the semiconductor active layer.

As an example, a method for forming the source electrode, the drain electrode and the light-shielding layer comprises: depositing a metal layer on a base substrate, forming both ends of the metal layer respectively as the source electrode layer and the drain electrode layer, oxidizing a middle portion of the metal layer to form the light-shielding layer.

As an example, forming the source electrode, the drain electrode and the light-shielding layer comprises forming a second source electrode and a second drain electrode, which comprises: making photoresist overlaying the second source electrode layer and the second drain electrode layer into a sawtooth photoresist by using a gray-tone or half-tone exposing technology, then performing dry or wet etching to form the second source electrode and the second drain electrode.

It will be described with reference to detailed embodiments in the following.

Figure 4:
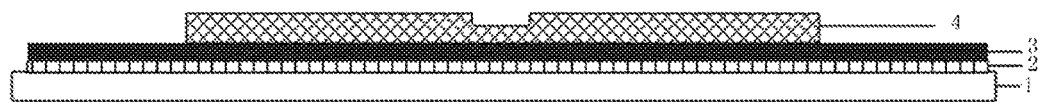
FIGS. 4 to 12 schematically illustrate configurations of the TFT provided by the embodiment of the invention during different phase of a fabrication procedure.

As illustrated in FIG. 4, a metal Ti film layer 2 is first deposited on a base substrate 1 by using magnetron sputtering; then a metal Mo film layer 3 is deposited on the metal Ti film layer 3. A total thickness of the metal Ti film layer 2 and the metal Mo film layer 3 is in the range of 1400 to 3400 Å. This thickness range can be adjustable as needed, such as adjusted according to the required resistance of the product. Photoresist is coated on the metal Mo film layer 3 and then exposed using the gray-tone or half-tone exposing technology. After being developed it forms a photoresist pattern 4 as illustrated in FIG. 4. The metal Ti film layer 2 and the metal Mo film layer 3 may also be formed via electron beam evaporation or the like.

Figure 5A:
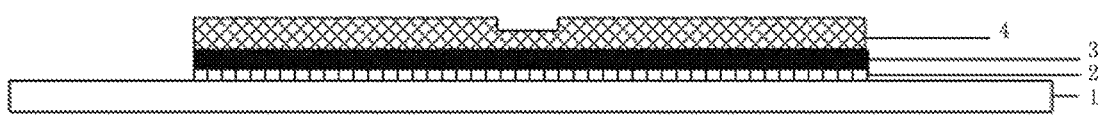

As illustrated in FIG. 5, the deposited metal Ti film layer 2 and the metal Mo film layer 3 are wet etched. During the etching, the metal Ti film layer 2 and the metal Mo film layer 3 in a region overlaid by the photoresist 4 is kept, while the metal Ti film layer and the metal Mo film layer in a region not overlaid by the photoresist is etched off to expose the base substrate 1.

Figure 5B:
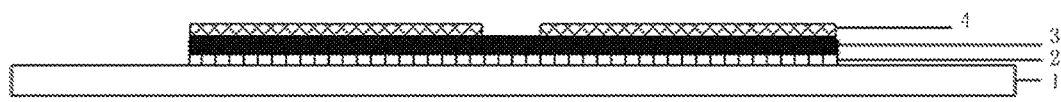
Figure 5C:
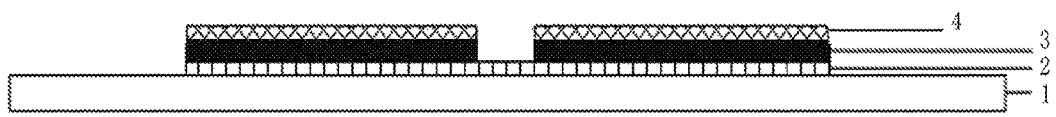
Figure 6:

The photoresist 4 of FIG. 5 is of different thicknesses. With reference to FIGS. 5b and 5c, when an ashing process is performed to remove the photoresist, a region having a thinner photoresist is completely removed to expose the metal Mo film layer 3, while the metal Mo film layer 3 in a region having a thicker photoresist is still overlaid by the photoresist 4. As an example, the region having the thinner photoresist corresponds to a region between the source electrode and the drain electrode. Then dry etching is performed. During the etching, the metal Mo film layer in the region not overlaid by the photoresist is etched off to expose the metal Ti film layer 2; while the metal Mo film layer 3 overlaid by the photoresist 4 is kept. After that, oxidization is performed to oxidize the exposed metal Ti film layer 2 to from a TiO.sub.x insulation layer. Meanwhile, the photoresist overlaying the metal Mo film layer 3 may be oxidized and completely removed. With reference to FIG. 6, the TiO.sub.x insulation layer obtained through oxidization may function as the light-shielding layer 6. The light-shielding layer 6 is mainly used to reflect backlight irradiation from the base substrate 1 side, thereby preventing the semiconductor active layer from being irradiated and causing the TFT to generate the leakage current. A part of the metal Ti film layer 2 illustrated in FIG. 5 is oxidized to form the light-shielding layer 6; the two parts other than that respectively form the first drain electrode layer 5 and the first source electrode layer 7, Similarly, after completely removing the photoresist overlaying the metal Mo film layer 3, the metal Mo film layer 3 illustrated in FIG. 5 form the second drain electrode layer 8 and the second source electrode layer 9.

Figure 7:
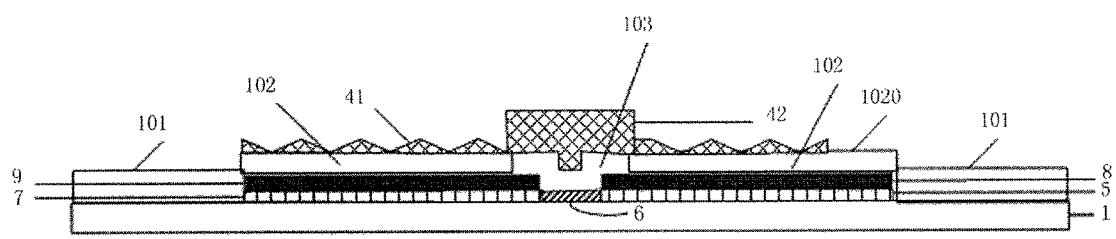

As illustrated in FIG. 7, based on the configuration illustrated in FIG. 6, a semiconductor active layer of metal oxide such as IGZO or IZO is deposited by using magnetron sputtering. The embodiment of the invention is described by taking a metal oxide IGZO semiconductor active layer as an example. The deposited semiconductor active layer of metal oxide IGZO comprises three regions 101, 102 and 103, wherein the metal oxide IGZO semiconductor active layer region 101 is located on the base substrate 1, the metal oxide IGZO semiconductor active layer region 102 is located on the second drain electrode layer 8 and the second source electrode layer 9, and the metal oxide IGZO semiconductor active layer region 103 is located above the light-shielding layer 6 and overlays the light-shielding layer 6. Photoresist is applied to the deposited metal oxide IGZO semiconductor active layer, and then exposed by using the gray-tone or half-tone exposing technology; after being developed, a photoresist pattern as illustrated in FIG. 7 is obtained. The metal oxide IGZO semiconductor active layer 101 has no overlaying photoresist, the photoresist 42 overlaying the metal oxide IGZO semiconductor active layer region 103 is flat, and the photoresist 41 overlaying the metal oxide IGZO semiconductor active layer region 102 is sawtooth-shaped. Herein a region 1020 in the metal oxide IGZO semiconductor active layer region 102 above the second drain electrode layer 8 has no overlaying photoresist, such that an upper surface of the second drain electrode layer 8 formed therebelow after subsequent etching is flat, a flat upper surface of the second drain electrode layer 8 will have a better contact with the subsequently formed pixel electrode. Furthermore, the metal oxide IGZO or IZO semiconductor active layer may also be fabricated using electron beam evaporation or the like; the semiconductor active layer may be amorphous silicon (a-Si) active layer or a poly-silicon (poly-Si) active layer.

Figure 8:
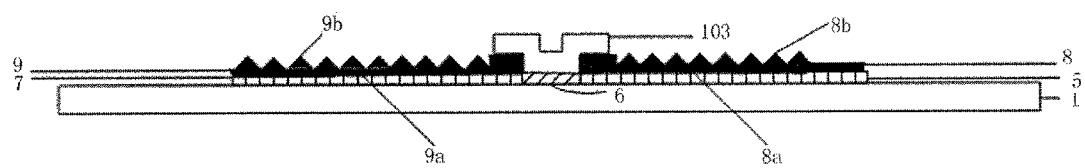

Detailed implementation for forming the reflective source electrode, the reflective drain electrode and the metal oxide IGZO semiconductor active layer comprises the following two embodiments:

Embodiment 1: based on FIG. 7, the metal oxide IGZO semiconductor active layer not overlaid by the photoresist is completely removed through dry etching. As the dry etching progresses, the thickness of the photoresist is also decreasing, the photoresist 41 overlaying the metal oxide IGZO semiconductor active layer region 102 is relatively thin, while the photoresist 42 overlaying the metal oxide IGZO semiconductor active layer region 103 is relatively thick. When the photoresist overlaying the metal oxide IGZO semiconductor active layer region 102 is completely etched off and the metal oxide IGZO semiconductor active layer is exposed, the dry etching is continued. The function of the metal oxide IGZO semiconductor active layer in the metal oxide IGZO semiconductor active layer region 102 is the same as the sawtooth photoresist 41 in FIG. 7. The metal oxide IGZO semiconductor active layer in the metal oxide IGZO semiconductor active layer region 102 may function as the sawtooth photoresist on the second source electrode layer 9 and the second drain electrode layer 8, continuing the dry etching will completely etch the metal oxide IGZO semiconductor active layer on the second source electrode layer 9 and the second drain electrode layer 8. The second source electrode layer 9 forms a sawtooth upper surface 9b and the second drain electrode layer 8 also forms a sawtooth upper surface 8b as illustrated in FIG. 8. On the other hand, during the whole dry etching process, the photoresist 42 overlaying the metal oxide IGZO semiconductor active layer region 103 is not etched off. After the dry etching, the photoresist 42 overlaying the metal oxide IGZO semiconductor active layer region 103 is removed, to obtain the metal oxide IGZO semiconductor active layer 103. Then the obtained metal oxide IGZO semiconductor active layer 103 is annealed. The fainted reflective drain electrode 8 and the reflective source electrode 9 may function as protection layers for the first drain electrode layer 5 and for the first source electrode layer 7; the reflective drain electrode 8 and the reflective source electrode 9 can reflect ambient light, while also protecting the underlying first drain electrode layer 5 and the first source electrode layer 7 from being oxidized by external oxygen.

Embodiment 2: when using the gray-tone or half-tone exposing technology to expose the photoresist applied to the metal oxide IGZO semiconductor active layer, the exposure amount has to be increased. After development, the photoresist 41 overlaying the metal oxide IGZO semiconductor active layer region 102 as shown in FIG. 7 is relatively thin, wherein at the place having the thinnest photoresist 41 the underlying metal oxide IGZO semiconductor active layer is exposed; the photoresist 42 overlaying the metal oxide IGZO semiconductor active layer region 103 is relatively thick. In the embodiment of the invention, a thickness of the photoresist 41 is about 5000~8000 Å, a thickness of the photoresist 42 is about 15000~25000 Å. The thicknesses of the photoresist 41 and 42 are not limited to the values described in the embodiment of the invention. After that wet etching is performed to completely etch off the metal oxide IGZO semiconductor active layer not overlaid by the photoresist. The etching liquid sprays and soaks; at this point the etching liquid flows continuously, and the wet etching is performed at all directions. With the progress of the wet etching, etching locations on the metal oxide IGZO semiconductor active layer region 102 connect with each other, the flowing etching liquid may wash the thin discrete photoresist on adjacent etching locations off, preliminarily forming the sawtooth shape, and the wet etching continues. At this point the metal oxide IGZO semiconductor active layer in the metal the metal oxide IGZO semiconductor active layer region 102 has the same function as the sawtooth photoresist 41 of FIG. 7; the metal oxide IGZO semiconductor active layer in the metal the metal oxide IGZO semiconductor active layer region 102 may function as the sawtooth photoresist on the second source electrode layer 9 and the second drain electrode layer 8. When the metal oxide IGZO semiconductor active layer above the second source electrode layer 9 and the second drain electrode layer 8 are completely etched off, the second source electrode layer 9 forms a sawtooth upper surface 9b, the second drain electrode layer 8 forms a sawtooth upper surface 8b, as illustrated in FIG. 8. During the whole wet etching procedure, the photoresist 42 overlaying the metal oxide IGZO semiconductor active layer region 103 is not etched off. After the whole wet etching is finished, the photoresist overlaying the metal oxide IGZO semiconductor active layer region 103 is removed to obtain the metal oxide IGZO semiconductor active layer 103. Then the obtained metal oxide IGZO semiconductor active layer 103 is annealed. The obtained reflective drain electrode 8 and the reflective source electrode 9 may respectively function as protection layers for the first drain electrode layer 5 and the first source electrode layer 7; the reflective drain electrode 8 and the reflective source electrode 9 can reflect ambient light, while also protecting the underlying first drain electrode layer 5 and the first source electrode layer 7 from being oxidized by external oxygen.

As illustrated in FIG. 8, the flat lower surface 8a in the second drain electrode layer 8 may effectively reflect light incident from the backlight at the base substrate side; the sawtooth upper surface 8b in the second drain electrode layer 8 may effectively reflect light scattered by the rotated and disordered liquid crystals. Therefore, the second drain electrode layer 8 comprising the flat lower surface 8a and the sawtooth upper surface 8b can prevent the generation of the leakage current in a better way. Similarly, the second source electrode layer 9 comprising the flat lower surface 9a and the sawtooth upper surface 9b can also prevent the generation of the leakage current in a better way. As illustrated in FIG. 8, the formed semiconductor active layer comprises two end portions overlapping with the source electrode and the drain electrode and a middle portion corresponding to the light-shielding layer.

Figure 9:
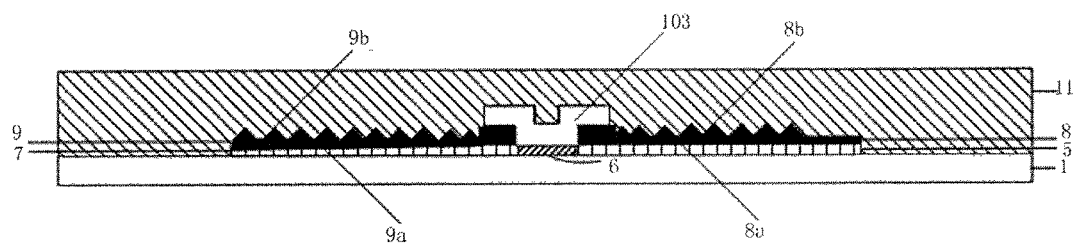

As illustrated in FIG. 9, a resin layer 11 is coated, based on the configuration illustrated in FIG. 8, and then the resin layer 11 is thermally cured. The condition of the thermal curing process comprises: an electromagnetic (EM) induction oven is used to heat to a temperature of 250° C., the heating temperature is lower than the melting point of the resin; meanwhile a protection gas argon (Ar) is introduced to thermally cure the soft resin material. The thermally cured resin layer 11 is hardened, and may function as the gate insulating layer. Furthermore, FIG. 9 is only a schematic illustration of the resin layer 11, a cross section of a real resin layer 11 may also be sawtooth shaped. The metal sawtooth structure together with the non-metal resin sawtooth structure in the embodiment of the invention can prevent the generation of the leakage current in a better way. The sawtooth source/drain electrodes make individual films fabricated thereon afterwards to have sawtooth structures. In comparison with a flat film, a sawtooth film increases the reflection area of the film, which theoretically has a better reflection effect. The invention forms the gate insulating layer with the resin layer, which has a higher reflectivity than inorganic materials such as silicon nitride or silicon oxide. Furthermore, resin has a good planarization effect. It can be contemplated that the gate insulating layer in the embodiment of the invention is not limited to the resin layer, but may be any other suitable gate insulation material.

Figure 10:
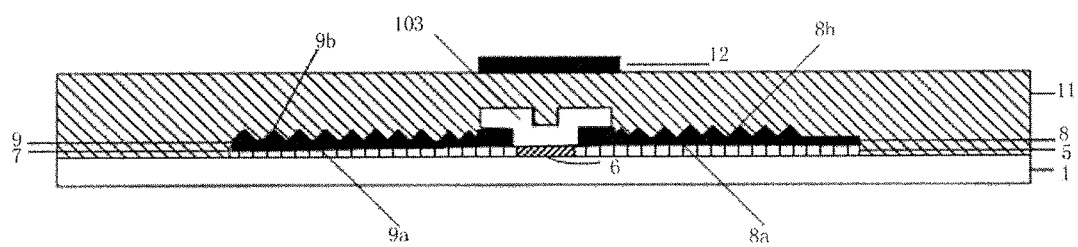

As illustrated in FIG. 10, a metal Mo layer with a thickness of 1400-3400 Å is deposited based on the configuration of FIG. 9, by using magnetron sputtering. Photoresist is coated on the deposited metal Mo layer; the applied photoresist is exposed and developed, and then wet etched to etch off the metal Mo in the region not covered by the photoresist; then the photoresist is removed to obtain the gate layer 12. The gate layer 12 is positioned over the metal oxide IGZO semiconductor active layer 103, and may also be used to block the externally incident light from irradiating the metal oxide IGZO semiconductor active layer 103. The metal Mo layer may also be formed by using electron beam evaporation or the like. Moreover, the gate layer 12 may also have two or multiple layers of metals, such as Al/Mo, or other metals, such as Ti and copper (Cu).

Figure 11:
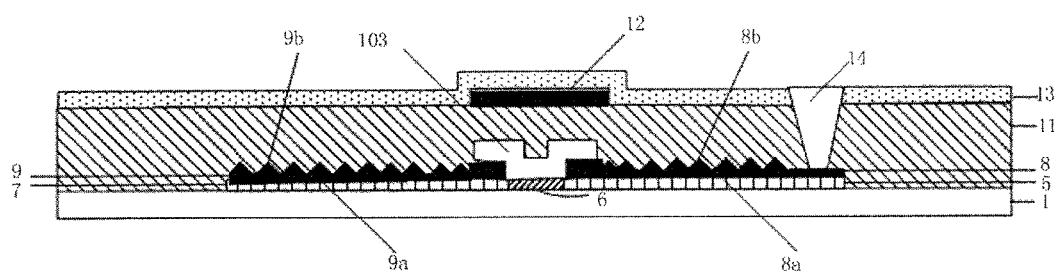

As illustrated in FIG. 11, a silicon nitride $SiN_x$ film with a thickness of 2500-6000 Å is deposited by using chemical vapor deposition (CVD) based on FIG. 10. Photoresist is coated on the deposited $SiN_x$ film; the applied photoresist is exposed and developed, and then dry etched to etch off the $SiN_x$ film in the region not covered by the photoresist; a via hole 14 is also formed by etch; the photoresist is then removed to obtain the passivation layer 13. When the via hole 14 is formed via dry etching, the passivation layer 13 and the resin layer 11 has to be etched off at the same time, and the second drain electrode 8 is exposed by the formed via hole 14. The passivation layer 13 is of an insulating material, such as silicon nitride, silicon oxide or an insulating macromolecular material.

Figure 12:
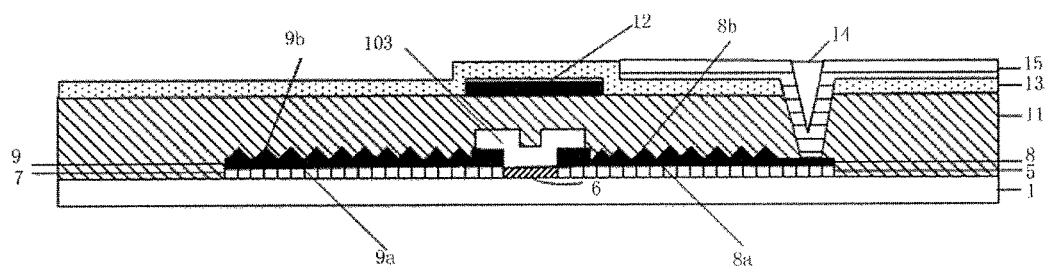

As illustrated in FIG. 12, an ITO film with a thickness of 400-600 Å is deposited by using magnetron sputtering based on FIG. 11. Photoresist is coated on the deposited ITO film; the applied photoresist is exposed and developed, and then wet etched to etch off the ITO film in the region not covered by the photoresist; after removing the photoresist, the pixel electrode 15 is obtained. The pixel electrode 15 is in contact with the second drain electrode layer 14 by way of the via hole 14. The ITO film may also be formed by using electron beam evaporation or the like.

The source/drain electrodes of the TFT fabricated in the embodiment of the invention have two metal layers; one of the two metal layers may be made of metal Ti and other low resistance metals such as Al. Metals with low resistance can reduce the resistance of the TFT while reducing the line width of the source electrode and the drain electrode. The other layer of the two metal layers may be made of Mo or other metals not readily reacting with oxygen. Metals not readily reacting with oxygen can function as the protection layer, protecting the underlying metals from being oxidized. Furthermore, the source/drain electrodes of the TFT fabricated in the embodiment of the invention are not limited to two metal layers, but may be a single metal layer or more than two layers of metals.

In summary, the embodiments of the invention provide a TFT, a method for fabricating the same, an array substrate and a display device. The TFT comprises a source electrode and a drain electrode, a semiconductor active layer, a gate insulating layer and a gate electrode; the TFT further comprises a light-shielding layer disposed between the source electrode and the drain electrode; the light-shielding layer separates the source electrode and the drain electrode, and the light-shielding layer is disposed on the light incident side of the semiconductor active layer, blocking the incident light from irradiating the semiconductor active layer, thereby solving the problem of causing the TFT to generate the leakage current with the semiconductor active layer irradiated by light. As a result, a TFT with highly stable properties is realized.

What are described above is related to the illustrative embodiments of the disclosure only and not limitative to the scope of the disclosure; the scopes of the disclosure are defined by the accompanying claims.

What is claimed is:

1. A Thin Film Transistor (TFT), comprising a source electrode and a drain electrode, a semiconductor active layer, a gate insulating layer and a gate electrode, and a light-shielding layer disposed between the source electrode and the drain electrode, wherein the light-shielding layer separates the source electrode and the drain electrode, and the light-shielding layer is disposed on a side of the semiconductor active layer which is further away from the gate electrode, wherein the light shielding layer blocks light, which causes leakage current in the TFT, from being incident on the gate electrode wherein a material of the light-shielding layer is an oxide of metal titanium, wherein the source electrode and the drain electrode have a dual-layer or multi-layer configuration, the source electrode at least comprises a first source electrode layer in a bottom layer and a second source electrode layer in a top layer, the drain electrode at least comprises a first drain electrode layer in a bottom layer and a second drain electrode layer in a top layer, wherein a material of the first source electrode layer is metal titanium, a material of the first drain electrode layer is metal titanium, wherein a material of the light-shielding layer is an oxide of the material of the first source electrode layer and the first drain electrode layer, the light-shielding layer is disposed in the same layer as the first source electrode layer and the first drain electrode layer, wherein the light-shielding layer is not overlapped with the first source electrode layer and the first drain electrode layer in a direction perpendicular to the light-shielding layer, and an end of the first source electrode layer and an end of the first drain electrode layer, which are opposed to each other, are connected to the light-shielding layer, respectively, wherein the first source electrode layer, the first drain electrode layer and the light-shielding layer are an integral structure, wherein a top surface the light-shielding layer is level with a top surface of the first source electrode layer and the first drain electrode layer.

2. The TFT of claim 1, wherein at least one of the second source electrode layer and the second drain electrode layer is a sawtooth protection layer.

3. The TFT of claim 1, wherein a material of the second source electrode layer is metal molybdenum or chrome, a material of the second drain electrode layer is metal molybdenum or chrome.

4. The TFT of claim 1, wherein the semiconductor active layer is disposed between the gate electrode and the light-shielding layer, the gate insulating layer is disposed between the semiconductor active layer and the gate electrode.

5. The TFT of claim 1, wherein the gate insulating layer is a resin layer.

6. The TFT of claim 2, wherein a material of the second source electrode layer is metal molybdenum or chrome, a material of the second drain electrode layer is metal molybdenum or chrome.

7. The TFT of claim 1, wherein the semiconductor active layer is disposed between the gate electrode and the light-shielding layer, the gate insulating layer is disposed between the semiconductor active layer and the gate electrode.

8. The TFT of claim 1, wherein the gate insulating layer is a resin layer.

9. The TFT of claim 1, wherein the first source electrode layer and the first drain electrode layer are connected with the light-shielding layer by chemical bonds.

10. An array substrate comprising:
a TFT, the TFT comprising:
a source electrode and a drain electrode, a semiconductor active layer, a gate insulating layer and a gate electrode, and a light-shielding layer disposed between the source electrode and the drain electrode, wherein the light-shielding layer separates the source electrode and the drain electrode, and the light-shielding layer is disposed on a side of the semiconductor active layer which is further away from the gate electrode, wherein the light shielding layer blocks light, which causes leakage current in the TFT, from being incident on the gate electrode wherein a material of the light-shielding layer is an oxide of metal titanium, wherein the source electrode and the drain electrode have a dual-layer or multi-layer configuration, the source electrode at least comprises a first source electrode layer in a bottom layer and a second source electrode layer in a top layer, the drain electrode at least comprises a first drain electrode layer in a bottom layer and a second drain electrode layer in a top layer, wherein a material of the first source electrode layer is metal titanium, a material of the first drain electrode layer is metal titanium, wherein a material of the light-shielding layer is an oxide of the material of the first source electrode layer and the first drain electrode layer, the light-shielding layer is disposed in the same layer as the first source electrode layer and the first drain electrode layer, wherein the light-shielding layer is not overlapped with the first source electrode layer and the first drain electrode layer in a direction perpendicular to the light-shielding layer, and an end of the first source electrode layer and an end of the first drain electrode layer, which are opposed to each other, are connected to the light-shielding layer, respectively, wherein the first source electrode layer, the first drain electrode layer and the light-shielding layer are an integral structure, wherein a top surface of the light-shielding layer is level with a top surface of :the first source electrode layer and the first drain electrode layer.

11. The array substrate of claim 10, wherein the first source electrode layer and the first drain electrode layer are connected with the light-shielding layer by chemical bonds.

* * * * *